(12) United States Patent
Starkston et al.

(10) Patent No.: US 11,515,248 B2
(45) Date of Patent: Nov. 29, 2022

(54) LOCALIZED HIGH DENSITY SUBSTRATE ROUTING

(71) Applicant: Intel Corporation, Santa Clara, CA (US)

(72) Inventors: Robert Starkston, Phoenix, AZ (US); Debendra Mallik, Chandler, AZ (US); John S. Guzek, Chandler, AZ (US); Chia-Pin Chiu, Tempe, AZ (US); Deepak Kulkarni, Chandler, AZ (US); Ravi V. Mahajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 281 days.

(21) Appl. No.: 17/009,308

(22) Filed: Sep. 1, 2020

(65) Prior Publication Data

US 2020/0395297 A1  Dec. 17, 2020

Related U.S. Application Data

(60) Continuation of application No. 16/002,740, filed on Jun. 7, 2018, now Pat. No. 10,796,988, which is a
(Continued)

(51) Int. Cl.
*H01L 25/18* (2006.01)
*H01L 23/522* (2006.01)
(Continued)

(52) U.S. Cl.
CPC ...... *H01L 23/5226* (2013.01); *H01L 23/5385* (2013.01); *H01L 24/06* (2013.01);
(Continued)

(58) Field of Classification Search
CPC ............... H01L 25/50; H01L 25/0655; H01L 2224/0401–83102; H01L 23/3114; H01L 23/5385; H01L 23/5386
See application file for complete search history.

(56) References Cited

U.S. PATENT DOCUMENTS

| 5,081,563 A | 1/1992 | Feng |
| 5,102,829 A | 4/1992 | Cohn |

(Continued)

FOREIGN PATENT DOCUMENTS

| CN | 1835229 | 9/2006 |
| CN | 101960589 | 1/2011 |

(Continued)

OTHER PUBLICATIONS

Office Action for German Patent Application No. 102014003462.3, dated Feb. 16, 2021, 6 pages.
(Continued)

*Primary Examiner* — Hoa B Trinh
(74) *Attorney, Agent, or Firm* — Schwabe, Williamson & Wyatt P.C.

(57) ABSTRACT

Embodiments of a system and methods for localized high density substrate routing are generally described herein. In one or more embodiments an apparatus includes a medium, first and second circuitry elements, an interconnect element, and a dielectric layer. The medium can include low density routing therein. The interconnect element can be embedded in the medium, and can include a plurality of electrically conductive members therein, the electrically conductive member can be electrically coupled to the first circuitry element and the second circuitry element. The interconnect element can include high density routing therein. The dielectric layer can be over the interconnect die, the dielectric layer including the first and second circuitry elements passing therethrough.

22 Claims, 5 Drawing Sheets

Related U.S. Application Data continuation of application No. 15/620,555, filed on Jun. 12, 2017, now Pat. No. 10,366,951, which is a continuation of application No. 15/049,500, filed on Feb. 22, 2016, now Pat. No. 9,679,843, which is a continuation of application No. 14/818,902, filed on Aug. 5, 2015, now Pat. No. 9,269,701, which is a division of application No. 13/630,297, filed on Sep. 28, 2012, now Pat. No. 9,136,236.

(51) Int. Cl.
  *H01L 25/00* (2006.01)
  *H01L 23/00* (2006.01)
  *H01L 25/065* (2006.01)
  *H01L 23/538* (2006.01)
  *H01L 21/56* (2006.01)

(52) U.S. Cl.
  CPC .......... *H01L 24/14* (2013.01); *H01L 25/0655* (2013.01); *H01L 25/50* (2013.01); *H01L 21/563* (2013.01); *H01L 24/05* (2013.01); *H01L 24/13* (2013.01); *H01L 25/18* (2013.01); *H01L 2224/0401* (2013.01); *H01L 2224/05541* (2013.01); *H01L 2224/05568* (2013.01); *H01L 2224/0603* (2013.01); *H01L 2224/131* (2013.01); *H01L 2224/1403* (2013.01); *H01L 2224/16225* (2013.01); *H01L 2224/16227* (2013.01); *H01L 2224/83102* (2013.01); *H01L 2924/12042* (2013.01); *H01L 2924/15192* (2013.01)

(56) References Cited

U.S. PATENT DOCUMENTS

| | | | |
|---|---|---|---|
| 5,111,278 | A | 5/1992 | Eichelberger |
| 5,227,013 | A | 7/1993 | Kumar |
| 5,241,456 | A | 8/1993 | Marcinkiewicz et al. |
| 5,285,352 | A | 2/1994 | Pastore et al. |
| 5,287,247 | A | 2/1994 | Smits et al. |
| 5,497,033 | A | 3/1996 | Fillion et al. |
| 5,664,772 | A | 9/1997 | Auerbach et al. |
| 5,703,400 | A | 12/1997 | Wojnarowski |
| 5,745,984 | A | 5/1998 | Cole, Jr. et al. |
| 5,761,044 | A | 6/1998 | Nakajima |
| 5,838,545 | A | 11/1998 | Clocher et al. |
| 5,859,474 | A | 1/1999 | Dordi |
| 5,903,052 | A | 5/1999 | Chen et al. |
| 6,011,694 | A | 1/2000 | Hirakawa |
| 6,084,297 | A | 7/2000 | Brooks et al. |
| 6,150,716 | A | 11/2000 | Macquarrie et al. |
| 6,154,366 | A | 11/2000 | Ma et al. |
| 6,229,203 | B1 | 5/2001 | Wojnarowski |
| 6,271,469 | B1 | 8/2001 | Ma et al. |
| 6,495,914 | B1 | 12/2002 | Sekine et al. |
| 6,506,632 | B1 | 1/2003 | Cheng et al. |
| 6,545,351 | B1 | 4/2003 | Jamieson et al. |
| 6,969,640 | B1 | 11/2005 | Dimaano, Jr et al. |
| 7,042,081 | B2 | 5/2006 | Wakisaka et al. |
| 7,176,506 | B2 | 2/2007 | Beroz et al. |
| 7,189,596 | B1 | 3/2007 | Mu |
| 7,402,901 | B2 | 7/2008 | Hatano |
| 7,659,143 | B2 | 2/2010 | Tang et al. |
| 7,777,351 | B1 | 8/2010 | Berry et al. |
| 7,851,894 | B1 | 12/2010 | Scanlan |
| 7,851,905 | B2 | 12/2010 | Chrysler et al. |
| 7,880,489 | B2 | 2/2011 | Eldridge et al. |
| 8,008,764 | B2 | 8/2011 | Joseph |
| 8,018,072 | B1 | 9/2011 | Miks et al. |
| 8,064,224 | B2 | 11/2011 | Mahajan et al. |
| 8,093,704 | B2 | 1/2012 | Palmer et al. |
| 8,227,904 | B2 | 7/2012 | Braunisch et al. |
| 8,319,338 | B1 | 11/2012 | Berry et al. |
| 8,345,441 | B1 | 1/2013 | Crisp et al. |
| 8,354,298 | B2* | 1/2013 | Tanaka ................ H01L 25/0657 438/109 |
| 8,461,036 | B2 | 6/2013 | Wu et al. |
| 8,482,111 | B2 | 7/2013 | Haba |
| 8,557,629 | B1 | 10/2013 | Kim et al. |
| 8,558,395 | B2 | 10/2013 | Khan et al. |
| 8,565,510 | B2 | 10/2013 | Cohn et al. |
| 8,823,144 | B2 | 9/2014 | Khan et al. |
| 8,823,158 | B2 | 9/2014 | Oh et al. |
| 8,866,308 | B2 | 10/2014 | Roy et al. |
| 8,872,321 | B2 | 10/2014 | Zhao |
| 8,883,563 | B1 | 11/2014 | Haba et al. |
| 8,912,670 | B2 | 12/2014 | Teh et al. |
| 9,136,236 | B2 | 9/2015 | Starkston et al. |
| 9,153,552 | B2 | 10/2015 | Teh et al. |
| 9,159,690 | B2 | 10/2015 | Chiu et al. |
| 9,171,816 | B2 | 10/2015 | Teh et al. |
| 9,190,380 | B2 | 11/2015 | Teh et al. |
| 9,269,701 | B2 | 2/2016 | Starkston et al. |
| 9,330,213 | B2* | 5/2016 | Matsumoto ............ G06F 30/39 |
| 9,349,703 | B2 | 5/2016 | Chiu et al. |
| 9,379,090 | B1 | 6/2016 | Syed |
| 9,431,371 | B2 | 8/2016 | Karikalan |
| 9,437,569 | B2 | 9/2016 | Teh et al. |
| 9,520,376 | B2 | 12/2016 | Teh et al. |
| 9,666,549 | B2 | 5/2017 | Chiu et al. |
| 9,679,843 | B2 | 6/2017 | Starkston et al. |
| 9,741,664 | B2 | 8/2017 | Chiu et al. |
| 9,831,169 | B2 | 11/2017 | Zhang |
| 9,929,119 | B2 | 3/2018 | Teh et al. |
| 10,199,346 | B2 | 2/2019 | Teh et al. |
| 10,366,951 | B2 | 7/2019 | Starkston et al. |
| 2001/0005047 | A1 | 6/2001 | Jimarez et al. |
| 2002/0070443 | A1 | 6/2002 | Mu et al. |
| 2003/0144405 | A1 | 7/2003 | Lewin et al. |
| 2003/0222344 | A1 | 12/2003 | Hosoyamada et al. |
| 2004/0173822 | A1 | 9/2004 | dutta |
| 2005/0067688 | A1 | 3/2005 | Humpston |
| 2005/0098891 | A1 | 5/2005 | Wakabayashi et al. |
| 2005/0218518 | A1 | 10/2005 | Jiang |
| 2005/0230835 | A1 | 10/2005 | Sunohara et al. |
| 2006/0038278 | A1 | 2/2006 | Wang |
| 2006/0046468 | A1 | 3/2006 | Akram et al. |
| 2006/0087036 | A1 | 4/2006 | Yang |
| 2006/0097379 | A1 | 5/2006 | Wang |
| 2006/0226527 | A1 | 10/2006 | Hatano et al. |
| 2006/0286301 | A1 | 12/2006 | Murata et al. |
| 2007/0114677 | A1 | 5/2007 | Kwon et al. |
| 2007/0128855 | A1 | 6/2007 | Cho et al. |
| 2007/0138644 | A1 | 6/2007 | Mcwilliams et al. |
| 2007/0145564 | A1 | 6/2007 | Honer |
| 2007/0148819 | A1 | 6/2007 | Haba et al. |
| 2007/0205496 | A1 | 9/2007 | Haba et al. |
| 2007/0216001 | A1* | 9/2007 | Nakamura ............ H01L 21/568 257/E23.114 |
| 2008/0017956 | A1 | 1/2008 | Lu |
| 2008/0054448 | A1 | 3/2008 | Lu et al. |
| 2008/0315398 | A1 | 12/2008 | Lo et al. |
| 2009/0045524 | A1 | 2/2009 | Mohammed et al. |
| 2009/0089466 | A1 | 4/2009 | Cunningham et al. |
| 2009/0206455 | A1 | 8/2009 | Harper et al. |
| 2009/0212407 | A1 | 8/2009 | Foster et al. |
| 2010/0072263 | A1 | 3/2010 | Gruber et al. |
| 2010/0072598 | A1 | 3/2010 | Oh et al. |
| 2011/0210443 | A1 | 9/2011 | Hart et al. |
| 2011/0227209 | A1 | 9/2011 | Yoon et al. |
| 2011/0228464 | A1 | 9/2011 | Guzek et al. |
| 2011/0233764 | A1 | 9/2011 | Chang et al. |
| 2011/0275177 | A1 | 11/2011 | Yim |
| 2012/0161331 | A1 | 6/2012 | Gonzalez et al. |
| 2013/0119536 | A1 | 5/2013 | Hada et al. |
| 2013/0214432 | A1 | 8/2013 | Wu et al. |
| 2013/0249116 | A1 | 9/2013 | Mohammed et al. |
| 2014/0070380 | A1 | 3/2014 | Chiu et al. |
| 2014/0091445 | A1 | 4/2014 | Teh et al. |
| 2014/0091474 | A1 | 4/2014 | Starkston et al. |
| 2014/0103527 | A1 | 4/2014 | Marimuthu |
| 2014/0113446 | A1 | 4/2014 | Pendse |

(56) References Cited

U.S. PATENT DOCUMENTS

| | | |
|---|---|---|
| 2014/0159228 A1 | 6/2014 | Teh et al. |
| 2014/0174807 A1 | 6/2014 | Roy |
| 2014/0264791 A1 | 9/2014 | Manusharow et al. |
| 2014/0332946 A1 | 11/2014 | Oh et al. |
| 2014/0367848 A1 | 12/2014 | Chi et al. |
| 2015/0084192 A1 | 3/2015 | Chiu et al. |
| 2015/0084210 A1 | 3/2015 | Chiu et al. |
| 2015/0104907 A1 | 4/2015 | Teh et al. |
| 2015/0194406 A1 | 7/2015 | Teh et al. |
| 2015/0236681 A1 | 8/2015 | We |
| 2015/0340353 A1 | 11/2015 | Starkston et al. |
| 2016/0027757 A1 | 1/2016 | Teh et al. |
| 2016/0043049 A1 | 2/2016 | Chiu et al. |
| 2016/0079196 A1 | 3/2016 | Teh et al. |
| 2016/0197037 A1 | 7/2016 | Starkston et al. |
| 2016/0247763 A1 | 8/2016 | Chiu et al. |
| 2017/0053887 A1 | 2/2017 | Teh et al. |
| 2017/0125334 A1 | 5/2017 | Wang et al. |
| 2017/0148737 A1 | 5/2017 | Fasano et al. |
| 2017/0287831 A1 | 10/2017 | Starkston et al. |
| 2018/0005945 A1 | 1/2018 | Pietambaram et al. |
| 2018/0026008 A1 | 1/2018 | Jeng et al. |
| 2018/0061741 A1 | 3/2018 | Beyne |
| 2018/0145047 A1 | 5/2018 | Teh et al. |
| 2019/0139926 A1 | 5/2019 | Teh et al. |

FOREIGN PATENT DOCUMENTS

| | | |
|---|---|---|
| CN | 102148206 | 8/2011 |
| CN | 102460690 | 5/2012 |
| CN | 103270586 | 8/2013 |
| CN | 104025289 | 9/2014 |
| CN | 104952838 | 9/2015 |
| DE | 102011053161 | 3/2012 |
| DE | 112013000494 T5 | 10/2014 |
| DE | 102014003462 | 9/2015 |
| EP | 2808891 | 12/2014 |
| JP | 2004-111415 | 4/2004 |
| KR | 10-2011-0123297 | 11/2011 |
| KR | 10-2012-0014099 | 2/2012 |
| KR | 10-2013-0007049 | 1/2013 |
| TW | 200409324 | 6/2004 |
| TW | M343241 | 10/2008 |
| TW | 201333710 | 8/2013 |
| TW | 201535667 | 9/2015 |
| TW | I550822 B | 9/2016 |
| WO | WO 0215266 A2 | 2/2002 |
| WO | WO 2014051714 | 4/2014 |

OTHER PUBLICATIONS

Notice of Allowance for German Patent Application No. 102014019989.4, dated Mar. 23, 2022, 5 pages.
Office Action for Korean Patent Application No. 2014-0030620, dated May 7, 2015, w/English translation, 9 pgs.
Notice of Allowance for Korean Patent Application No. 2014-0030620, dated Nov. 6, 2015, w/English translation, 4 pgs.
Office Action for Taiwan Application No. 103107035 dated Oct. 23, 2015, 7 pgs., with English translation.
Notice of Allowance for Taiwan Application No. 103107035 dated May 24, 2016, 2 pgs., no translation.
Office Action for Germany Patent Application No. 102014003462.3, dated Dec. 3, 2014, 19 pages.
Office Action for Germany Patent Application No. 102014003462.3, dated Apr. 24, 2017, 9 pages.
Office Action for Chinese Patent Application No. 20140116450.7, dated Jun. 2, 2017, with English translation, 19 pages.
Office Action for Chinese Patent Application No. 20140116450.7, dated Feb. 5, 2018, with English translation, 23 pages.
Office Action for Chinese Patent Application No. 20140116450.7, dated Aug. 29, 2018, with English translation, 29 pages.
Office Action for Chinese Patent Application No. 20140116450.7, dated Feb. 22, 2019, with English translation, 29 pages.
Notice of Allowance Chinese Patent Application No. 20140116450.7, dated May 13, 2019, with English translation, 6 pages.
Braunisch, Henning, et al. "High-speed performance of Silicon and Bridge die-to-die interconnects", Electrical Performance of Electronic Packaging and Systems (EPEPS), IEEE 20th conference, (Oct. 23, 2011), 95-98.
Kumagai, K, et al., "A silicon interposer BGA package with Cu-filled TSV and multi-layer Cu-plating interconnect", Proc. IEEE Electronic Components and Technol. Conf. (ECTC), Lake Buena vista, FL, (May 27-30, 2008), 571-576.
Sunohara, M, et al. "silicon Interposer with TSVs (through silicon vias) and fine multilayer wiring", Proc. IEEE Electronic Components and Technol., Conf. (ECTC), (May 27-30, 2008), 847-852.
Towle, Steven N., et al. "Bumpless Build-Up Layer Packaging", (2001), 7 pgs.
International Search Report and Written Opinion for International Patent Application No. PCT/US2013/044001 dated Aug. 27, 2013, 9 pgs.
International Preliminary Report Patentability for International Patent Application No. PCT/US2013/044001 dated Apr. 9, 2015, 8 pgs.
Office Action for German Patent Application No. 102014003462.3, dated Nov. 30, 2021, 6 pages.
Office Action for German Patent Application No. 102014019989.4, dated Nov. 22, 2021, 5 pages.

* cited by examiner

LOCALIZED HIGH DENSITY SUBSTRATE ROUTING

CROSS-REFERENCE TO RELATED APPLICATION

This application is a continuation of U.S. patent application Ser. No. 16/002,740, filed Jun. 7, 2018, which is a continuation of U.S. patent application Ser. No. 15/620,555, filed Jun. 12, 2017, now U.S. Pat. No. 10,366,951, issued Jul. 30, 2019, which is a continuation of U.S. patent application Ser. No. 15/049,500, filed Feb. 22, 2016, now U.S. Pat. No. 9,679,843, issued Jun. 13, 2017, which is a continuation of U.S. patent application Ser. No. 14/818,902, filed Aug. 5, 2015, now U.S. Pat. No. 9,269,701, issued Feb. 23, 2016, which is a divisional of U.S. patent application Ser. No. 13/630,297, filed Sep. 28, 2012, now U.S. Pat. No. 9,136,236, issued Sep. 15, 2015, each of which are incorporated by reference herein in their entirety.

TECHNICAL FIELD

This disclosure relates generally to electronic chip architectures.

BACKGROUND ART

Semiconductor devices, such as electronic devices, can include substrate routing that is of a lower density than some of the routing in a chip that is attached to the substrate. Such devices can include complex routing schemes especially in areas where the attached chip includes higher density routing than the routing in the substrate.

DESCRIPTION OF EMBODIMENTS

Figure 1:
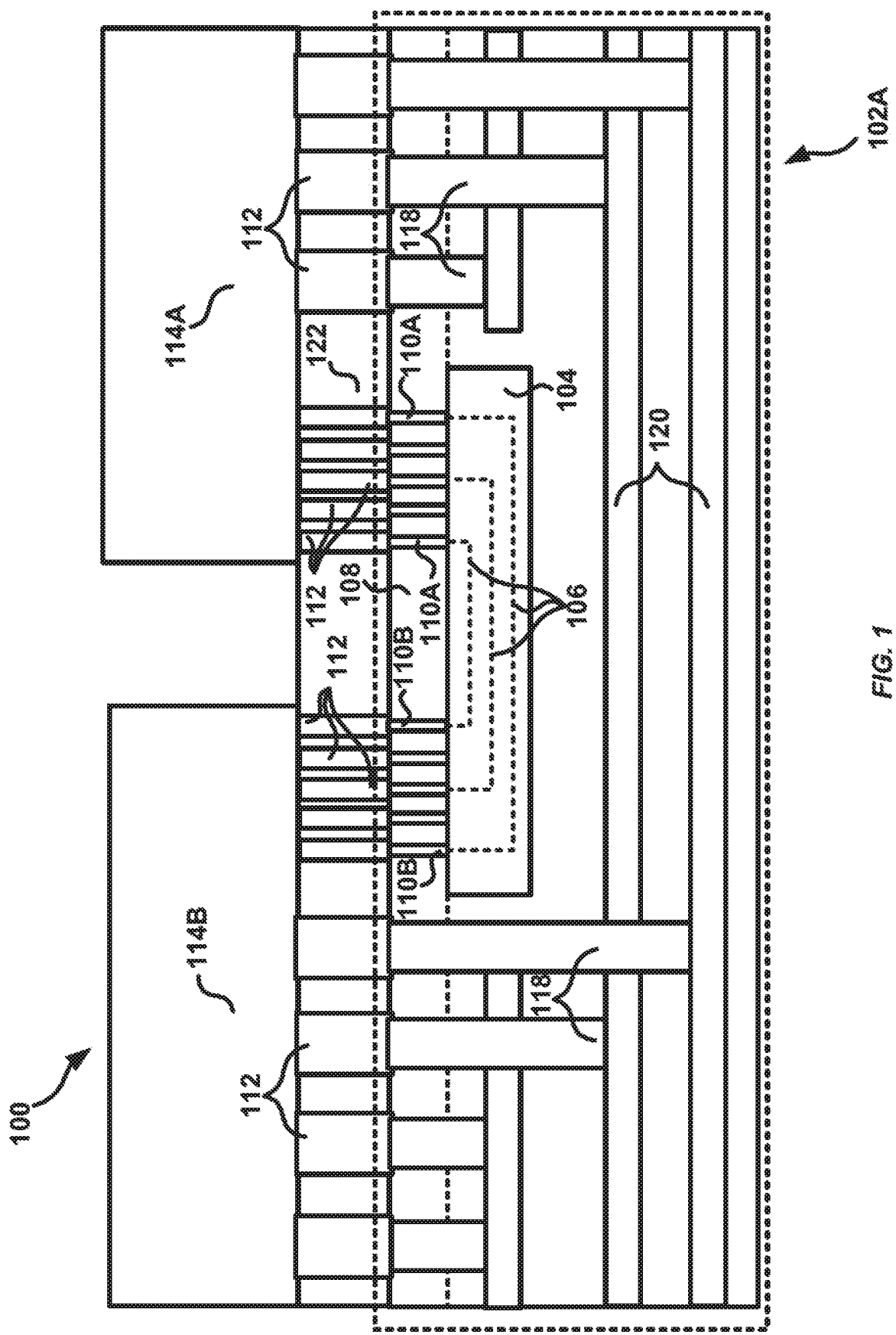
FIG. 1 shows an example of an apparatus including localized high density substrate routing, in accord with one or more embodiments.

The following description and the drawings sufficiently illustrate specific embodiments to enable those skilled in the art to practice them. Other embodiments can incorporate structural, logical, electrical, process, or other changes. Portions and features of some embodiments can be included in, or substituted for, those of other embodiments. Embodiments set forth in the claims encompass all available equivalents of those claims.

Embodiments of a system and method for localized high density substrate routing are generally described herein. In one or more embodiments, an apparatus includes a medium, first and second circuitry elements, one or more interconnect elements, and a dielectric layer. The medium can include low density routing therein. The interconnect element can be embedded in the medium, and can include a plurality of electrically conductive members therein, an electrically conductive member of the electrically conductive members can be electrically coupled to the first circuitry element and the second circuitry element. The interconnect element can include high density routing therein. The dielectric layer can be over the interconnect element, the dielectric layer can include the first and second circuitry elements passing therethrough.

Substrate solutions can be used to provide chip to chip interconnections. The I/O (Input/Output) density in a package substrate can be determined by the minimum trace and space dimensions of the substrate. The minimum trace and space dimensions can be limited by the resolution of the lithography and plating processes used in the substrate manufacturing process(es). This limitation can be a function of the economic cost to achieve the resolution. The routing density in a multichip substrate can be about one hundred (100) times less dense than a routing density in a chip level routing process. Problems associated with using the lower routing densities can include larger areas of the substrate dedicated to I/O and decreased system and power performance.

A problem associated with prior multichip package substrates can be the inability to utilize chip level routing densities for substrate routing in a cost-effective or manufacturing-friendly way. A solution to the problem can include using a high density interconnect element (e.g., an interconnect die or interconnect chip) that includes chip level routing (e.g., high density routing) embedded in a medium (e.g., a substrate). This solution can provide a localized high density routing element that permits localized high bandwidth (e.g., density) chip to chip interconnects to be created or the ability to modify a package design and add functionality that can benefit from a high bandwidth chip to chip interconnect without requiring major changes to the fabrication process. Such a solution can also provide high density interconnects only where the high density interconnects are useful, thus allowing less expensive lithography and plating processes to be used for conventional package routing (e.g., low density routing) in areas of the substrate where the high density interconnect is not useful or desired. This solution can also provide for dimensional variation in placement of a high density interconnect element when the interconnect element is embedded in the N−1 layer (e.g., the layer below the top layer of the substrate (the N layer)), or below. In embodiments including more than one interconnect element the alignment of one interconnect element can be independent of another interconnect element. Embodiments including the high density interconnect embedded below the top layer of the substrate can unify the package core routing and high bandwidth interconnect routing into a single imaged bump field on the substrate for subsequent chip attach. Also, such a solution can provide for chips to be routed differently, and possibly more economically. The high bandwidth interconnect routing can be isolated to a portion of the chip at or near a location where the high bandwidth interconnect coupling will physically occur, thus leaving the remainder of the chip space for low density routing. By including pads on the interconnect element that are sized or shaped larger than a circuitry element (e.g., an electrically conductive via) variation in the placement of the circuitry element can be tolerated.

FIG. 1 shows an example of an apparatus 100 that can include localized high density substrate routing. The apparatus 100 can include a medium 102A, one or more high density interconnect elements 104, an optional dielectric layer 108, one or more first circuitry elements 110A, one or more second circuitry elements 110B, an optional adhesive layer 122, or one or more dies 114A-B.

The medium 102A can include low density interconnect routing therein. The medium 102A can be a substrate, such as a semiconductor substrate (e.g., a silicon, gallium, indium, germanium, or variations or combinations thereof, among other substrates), one or more insulating layers, such as glass-reinforced epoxy, such as FR-4, polytetrafluoroethylene (Teflon), cotton-paper reinforced epoxy (CEM-3), phenolic-glass (G3), paper-phenolic (FR-1 or FR-2), polyester-glass (CEM-5), any other dielectric material, such as glass, or any combination thereof, such as can be used in printed circuit boards (PCBs). The medium 102A can be made using a bumpless buildup layer process (BBUL) or other technique of creating the medium 102A. A BBUL process includes one or more build-up layers formed underneath an element, such as a high density interconnect element 104 or a die 114. A micro via formation process, such as laser drilling, can form connections between build-up layers and die or dice bond pads. The build-up layers may be formed using a high-density integration patterning technology. Die or dice 114 and the high density interconnect element 104 can be embedded in the substrate, or electrically connected using a BBUL, or other process.

The high density interconnect element 104 can include a plurality of electrically conductive members 106 disposed, placed, formed, or otherwise situated therein. The electrically conductive members 106 can be situated within the high density interconnect element 104 with gaps between electrically conductive members 106 that can be smaller (e.g., up to about 100 times smaller) than can be possible with conventional substrate routing techniques (e.g., the high density interconnect element 104 can include high density substrate routing therein), such as by using a die routing technique to create the high density interconnect element 104. The high density interconnect element 104 can be a semiconductor die, such as a silicon die. The high density interconnect element 104 can include at least one layer of glass, ceramic, or organic materials.

Figure 3:
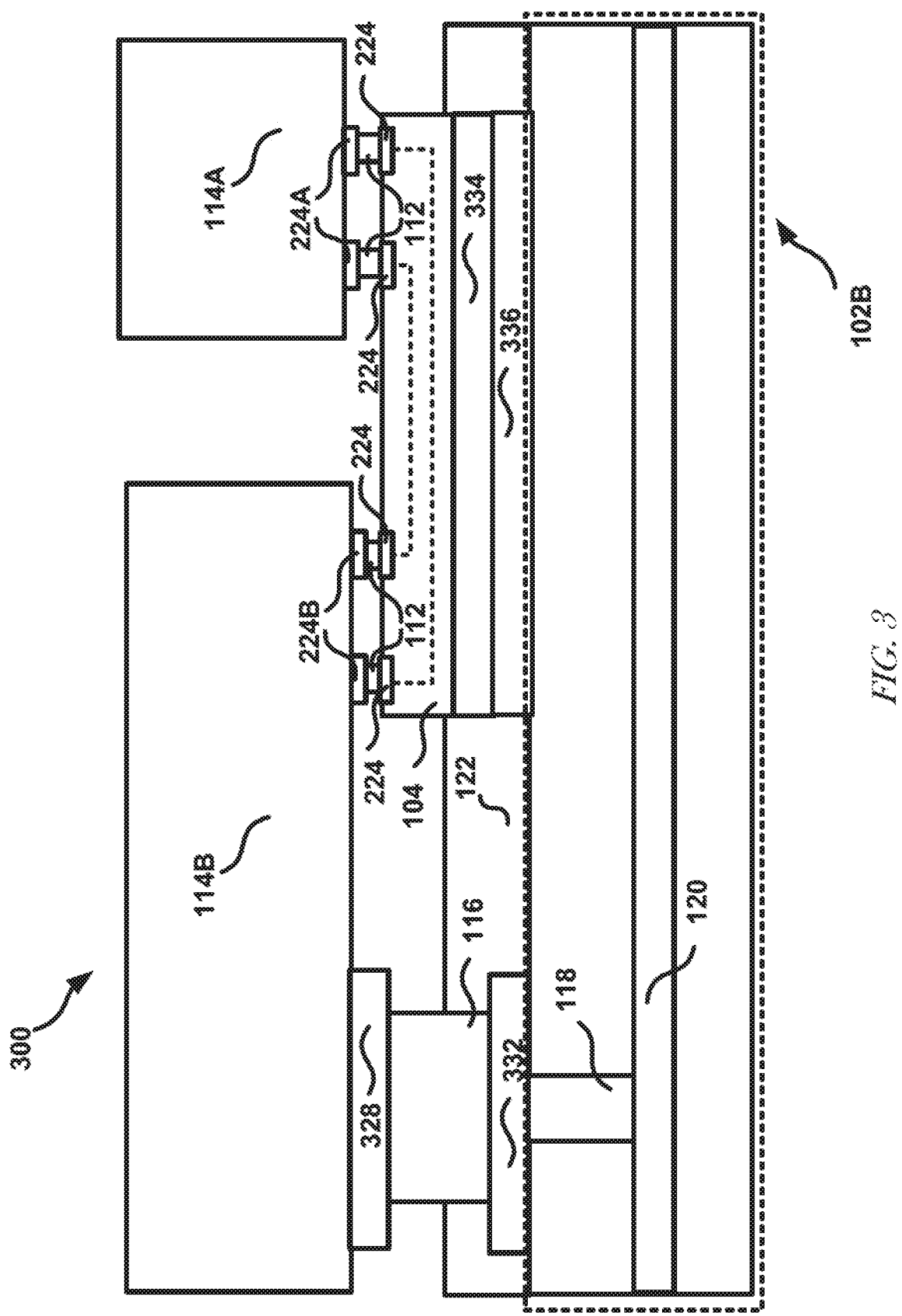
FIG. 3 shows an example of another apparatus including localized high density substrate routing, in accord with one or more embodiments.

The high density interconnect element 104 can be situated within the medium 102A at a layer below the surface (e.g., the N−1 layer or below) or can be situated over a top surface (e.g., the N layer) of the medium 102A, such as shown in FIG. 3.

Figure 2:
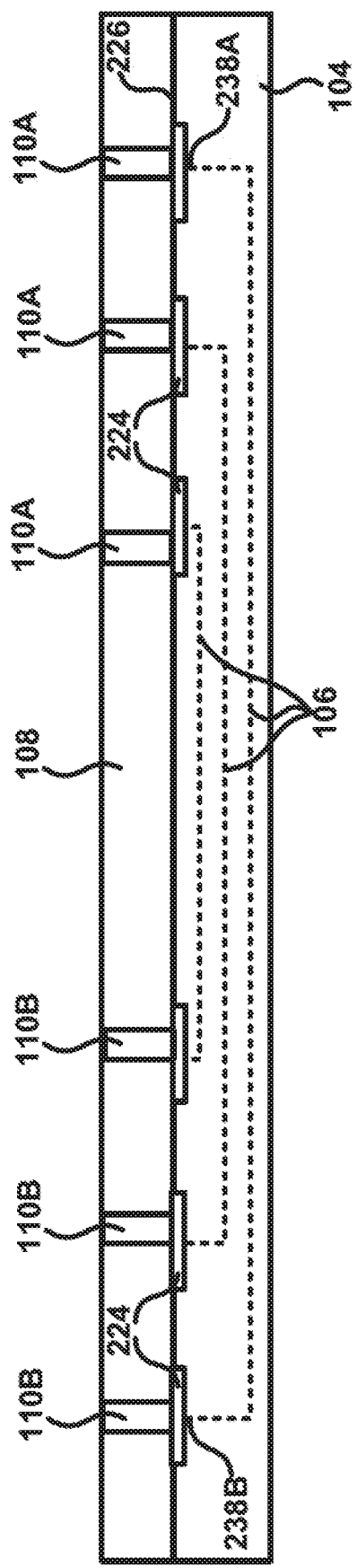
FIG. 2 shows an example of a high density interconnect element, in accord with one or more embodiments.

The high density interconnect element 104 can include electrically conductive pads 224 situated on, or at least partially in the high density interconnect element 104, such as on, or at least partially under, a top surface 226 of the high density interconnect element 104, such as shown in FIG. 2. The electrically conductive pads 224 can be electrically coupled between the electrically conductive member 106 and the circuitry element 110A-B, such as shown in FIG. 2. The electrically conductive pads 224 can include conductive metal, such as copper, gold, silver, aluminum, zinc, nickel, brass, bronze, iron, etc. The electrically conductive pads 224 (e.g., high density electrically conductive pad 224) can include a footprint with an area larger than a corresponding footprint area of a circuitry element 110. Such a configuration can allow for dimensional variation in manufacturing or in situating the high density interconnect element 104 within the medium 102. The electrically conductive pads 224 can include a footprint that is circular, square, rectangular, triangular, or a combination thereof, among others. The footprint area of the electrically conductive pads 224 can be between about 175 um$^2$ to 10,000 um$^2$, such as an electrically conductive pad 224 that includes a footprint dimension that is 50 um, such as an electrically conductive pad 224 that is square with a footprint area of about 2500 um$^2$ or circular with a footprint area of about 1963 um$^2$. In some embodiments, the electrically conductive pads 224 can include a footprint area of between about 1900 um$^2$ to 2550 um$^2$.

The dielectric layer 108 can be situated over the high density interconnect element 104 (an example of a lower boundary of the dielectric layer 108 is indicated by the horizontal dashed line in the medium 102A). The dielectric layer 108 can include circuitry elements 110 passing therethrough. Including the dielectric layer 108 can help allow for dimensional variation in the placement, embedding, or otherwise situating of the high density interconnect element 104 at least partially within or on the medium 102A. The dielectric layer 108 can include oxide, or other materials, such as insulating materials.

The high density interconnect element 104 can include interconnection circuitry, such as the first and second circuitry elements 110A-B that can be high density circuitry elements 110. The circuitry elements 110A-B can be configured to electrically couple to the electrically conductive member 106, such as by electrically coupling a high density electrically conductive pad 224A-B of the die 114A-B to a high density electrically conductive pad 224 of the high density interconnect element 104. The circuitry elements 110A-B can be electrically conductive vias. The circuitry elements 110 can include a footprint area between about 175 um$^2$ to 3,600 um$^2$, such as a circuitry element 110 that includes a footprint dimension that is about 30 um, such as a circuitry element 110 that is substantially circular with a footprint area of about 707 um$^2$ or substantially square with a footprint area of about 900 um$^2$. In some embodiments, the circuitry elements 110 can include a footprint area between about 600 um$^2$ to 1,000 um$^2$.

One or more dies 114A-B can be situated over the medium 102. The dies 114A-B can be electrically coupled to the circuitry element 110A-B through an electrically conductive adhesive 112, such as solder, tape, glue, or other electrically conductive adhesive. The electrically conductive adhesive 112 can electrically couple the first die 114A to the second die 114B, such as by electrically coupling a high density electrically conductive pad 224A on, or at least partially in, the first die 114A to an electrically conductive pad 224B on, or at least partially in, the second die 114B. The first or second die 114A-B can be a logic, memory, central processing unit (CPU), graphics, radio, or any other type of die or package. The electrically conductive pad 224 of the high density interconnect element 104 can be situated between a circuitry element 110 and an end 238A-B of the electrically conductive member 106.

The first and second dies 114A-B can include a low density interconnect pad 328, such as can be used for power, ground, or other electrical coupling, coupled thereto. The low density interconnect pad 328 can be electrically coupled, such as through low density interconnect element 118, to a bus 120, such as a power, ground, or data bus. The low density interconnect pad 328 can be electrically coupled to an electrically conductive pad 332, such as through conductive adhesive 116. The conductive adhesive 116 can be solder (e.g., solder paste), electroplating, or microball, such as a microball configured for flip chip interconnect (e.g., controlled collapse chip connection (C4) interconnect).

The adhesive layer 122 can be operable to prevent conductive adhesive 116 from bridging between conductors, such as to help prevent short circuits. The adhesive layer 122 can be solder resist (e.g., solder mask), electrically conductive glue resist, silica laden capillary underfill, or other type of insulator operable to prevent bridging between conductors. The adhesive layer 122 can be situated over the dielectric layer 108 and then selectively removed to expose, at least partially, circuitry elements 110 or electrically conductive pads 332 or 224; or the adhesive layer 122 can be selectively situated over the dielectric layer 108 such that electrically conductive elements, such as circuitry elements 110, are not fully covered by the adhesive layer 122. The adhesive layer 122 can be dispensed at or near the edge of the die 114 and flowed under the die 114, such as by using air pressure or a capillary action, such as to at least partially fill spaces between conductors underneath the die 114.

FIG. 2 shows an example of dimensional variation in the placement of first or second circuitry elements 110 or high density interconnect element 104. By including a high density electrically conductive pad 224 that includes a footprint area that is bigger than the footprint area of a circuitry element 110 to be coupled thereto, some error in the placement of the circuitry elements 110, high density electrically conductive pads 224, the holes in which the circuitry elements 110 will be formed, or the placement of the high density interconnect element 104 can be tolerated.

The high density interconnect element 104 can electrically couple more than two die 114 concurrently, such as a CPU die coupled to one or more of a memory, logic, graphics, other CPU die, or other type of die.

FIG. 3 shows an example of an apparatus 300 that can include the high density interconnect element 104 above the top layer of medium 102B. In such an embodiment, the high density interconnect element 104 can be fixed in place through an adhesive layer 334, such as a solder layer. The adhesive layer 334 can affix the high density interconnect element 104 to an optional metal pad 336, such as a copper pad, or directly to the medium 102B. The metal pad 336 can act as a stop layer for laser ablating through the adhesive layer 334, such as to stop a laser from penetrating into the medium 102B. Such a configuration can allow for better control in the placement or attachment of the high density interconnect element 104.

Figure 4:
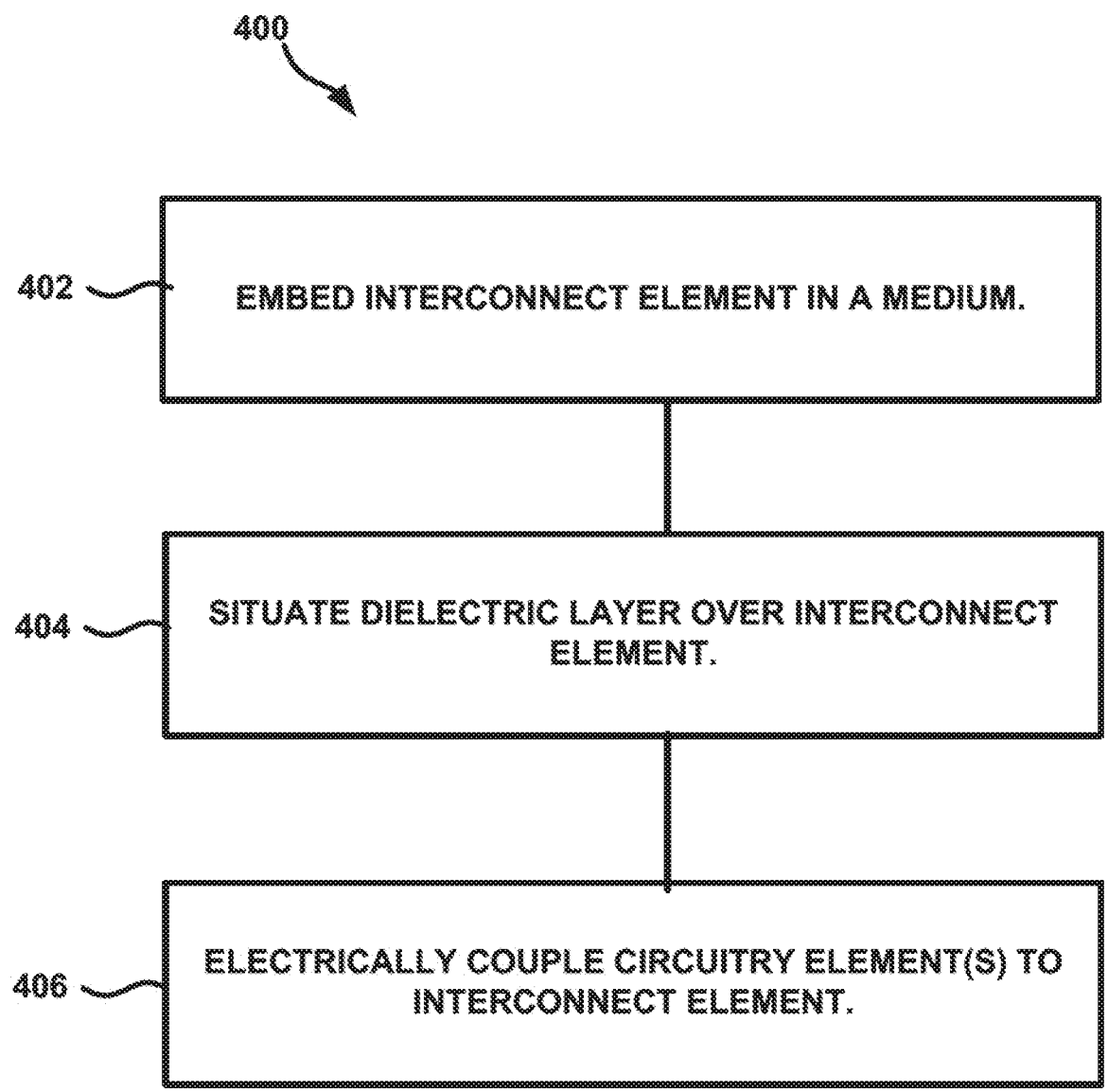
FIG. 4 shows an example of a technique of making an apparatus with localized high density substrate routing, in accord with one or more embodiments.

FIG. 4 shows an example of a technique 400 of making a device that can include a high density interconnect element 104. At 402, the high density interconnect element 104 can be embedded in the medium 102. The high density interconnect element 104 can include one or more electrically conductive members 106. At 404, a dielectric layer 108 can be situated over the high density interconnect element 104. At 406, circuitry elements 110 can be electrically coupled to the high density interconnect element 104, such as to electrically couple two circuitry elements 110A-B to each other.

Figure 5:
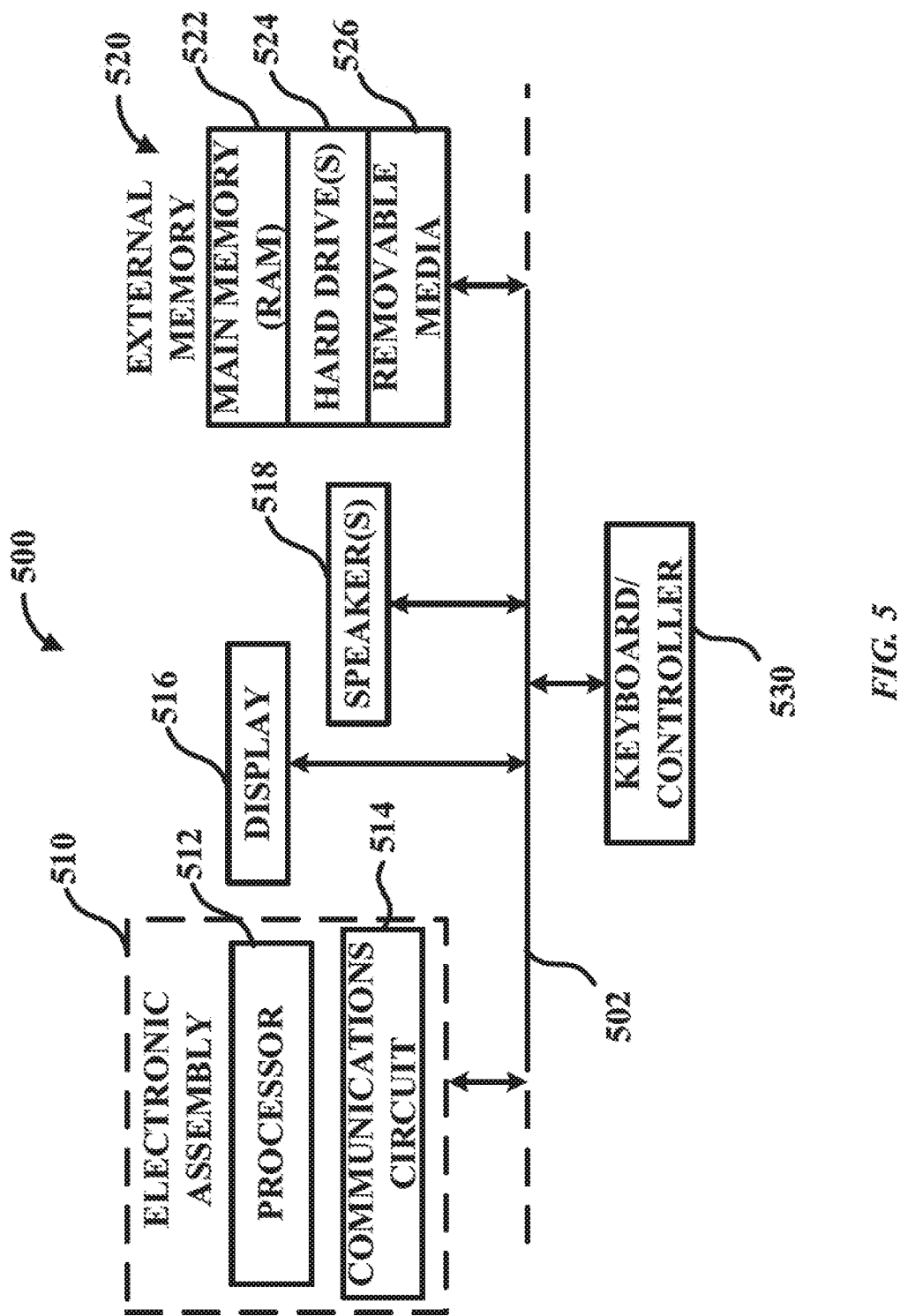
FIG. 5 shows an example of an electronic device, in accord with one or more embodiments.

An example of an electronic device using one or more high density interconnect element(s) 104 is included to show an example of a device application for the present disclosure. FIG. 5 shows an example of an electronic device 500 incorporating one or more high density interconnect element (s) 104. Electronic device 500 is merely one example of a device in which embodiments of the present disclosure can be used. Examples of electronic devices 500 include, but are not limited to, personal computers, tablet computers, supercomputers, servers, telecommunications switches, routers, mobile telephones, personal data assistants, MP3 or other digital music players, radios, etc. In this example, electronic device 500 comprises a data processing system that includes a system bus 502 to couple the various components of the system. System bus 502 provides communications links among the various components of the electronic device 500 and can be implemented as a single bus, as a combination of busses, or in any other suitable manner.

An electronic assembly 510 is coupled to system bus 502. The electronic assembly 510 can include a circuit or combination of circuits. In one embodiment, the electronic assembly 510 includes a processor 512 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 510 are a custom circuit, an application-specific integrated circuit (ASIC), or the like, such as, for example, one or more circuits (such as a communications circuit 514) for use in wireless devices like mobile telephones, pagers, personal data assistants, portable computers, two-way radios, and similar electronic systems. The IC can perform any other type of function.

The electronic device 500 can include an external memory 520, which in turn can include one or more memory elements suitable to the particular application, such as a main memory 522 in the form of random access memory (RAM), one or more hard drives 524, and/or one or more drives that handle removable media 526 such as compact disks (CD), digital video disk (DVD), and the like.

The electronic device 500 can also include a display device 516, one or more speakers 518, and a keyboard and/or controller 530, which can include a mouse, trackball, touch screen, voice-recognition device, or any other device that permits a system user to input information into and receive information from the electronic device 500.

Additional Notes and Examples

In Example 1 an apparatus comprises a medium including low density interconnect routing therein.

In Example 2, the apparatus of Example 1 includes a first circuitry element and a second circuitry element.

In Example 3, the apparatus of at least one of Examples 1-2 includes an interconnect element.

In Example 4, the interconnect element of at least one of Examples 1-3 is embedded in the medium.

In Example 5, the interconnect element of at least one of Examples 1-4 includes high density substrate routing therein.

In Example 6, the interconnect element of at least one of Examples 1-5 includes a plurality of electrically conductive members.

In Example 7, an electrically conductive member of the plurality of electrically conductive members of at least one of Examples 1-6 is electrically coupled to the first circuitry element and the second circuitry element.

In Example 8, the apparatus of at least one of Examples 1-7 includes a dielectric layer, the dielectric layer over the interconnect die, the dielectric layer including the first and second circuitry elements passing therethrough.

In Example 9, the medium of at least one of Examples 1-8 is a substrate.

In Example 10, the medium of at least one of Examples 1-9 is a semiconductor (e.g., silicon) substrate.

In Example 11, the interconnect element of at least one of Examples 1-10 is an interconnect die.

In Example 12, the apparatus of at least one of Examples 1-11 includes a first die.

In Example 13, the first die of at least one of Examples 1-12 is electrically coupled to the first circuitry element.

In Example 14, the first die of at least one of Examples 1-13 is situated over the medium.

In Example 15, the apparatus of at least one of Examples 1-14 includes a second die.

In Example 16, the second die of at least one of Examples 1-15 is electrically coupled to the second circuitry element.

In Example 17, the second die of at least one of Examples 1-16 is situated over the medium.

In Example 18, the first die of at least one of Examples 1-17 is a logic die.

In Example 19, the second die of at least one of Examples 1-18 is a memory die.

In Example 20, the first circuitry element of at least one of Examples 1-19 is a first electrically conductive via.

In Example 21, the second circuitry element of at least one of Examples 1-20 is a second electrically conductive via.

In Example 22, the first electrically conductive via of at least one of Examples 1-21 is electrically coupled to a first pad.

In Example 23, the first pad of at least one of Examples 1-22 is on, or at least partially in, a top surface of the interconnect die.

In Example 24, the first pad of at least one of Examples 1-23 is situated between (1) the first electrically conductive via and (2) a first end of the electrically conductive member.

In Example 25, the second circuitry element of at least one of Examples 1-24 is electrically coupled to a second pad.

In Example 26, the second pad of at least one of Examples 1-25 is on, or at least partially in, the top surface of the interconnect die.

In Example 27, the second pad of at least one of Examples 1-26 is situated between (1) the second electrically conductive via and (2) a second end of the electrically conductive member.

In Example 28, the first pad of at least one of Examples 1-27 includes a footprint dimension of 50 micrometers.

In Example 29, the first circuitry element of at least one of Examples 1-28 includes a footprint dimension of about 30 micrometers.

In Example 30, the apparatus of at least one of Examples 1-29 includes adhesive.

In Example 31, the adhesive of at least one of Examples 1-30 is solder resist.

In Example 32, the adhesive of at least one of Examples 1-31 is over the dielectric layer.

In Example 33, the adhesive of at least one of Examples 1-32 is not fully covering the first and second circuitry elements.

In Example 34, the apparatus of at least one of Examples 1-33 can be situated in a package.

In Example 35, the first die of at least one of Examples 1-34 is electrically coupled to the second die through the first electrically conductive via and the second electrically conductive via.

In Example 36, the second pad of at least one of Examples 1-35 includes a footprint with a dimension of 50 micrometers.

In Example 37, the second circuitry element of at least one of Examples 1-36 includes a footprint with a dimension of about 30 micrometers.

In Example 38, the interconnect element of at least one of Examples 1-37 is a silicon interconnect die In Example 39, a method comprises embedding a high density interconnect element 104 in a medium 102.

In Example 40, the method of at least one of Examples 1-39 includes electrically coupling first and second circuitry elements 110 to an electrically conductive member 106 of the interconnect element.

In Example 41, the method of at least one of Examples 1-40 includes situating a dielectric layer 108 over the interconnect element.

In Example 42, the method of at least one of Examples 1-41 includes situating a first die 114A over the medium.

In Example 43, the method of at least one of Examples 1-42 includes electrically coupling the first die to the first circuitry element.

In Example 44, the method of at least one of Examples 1-43 includes situating a second die 114B over the medium.

In Example 45, the method of at least one of Examples 1-44 includes electrically coupling the second die to the second circuitry element.

In Example 46, situating the first die over the medium of at least one of Examples 1-45 includes situating a logic die over the substrate.

In Example 47, situating the second die over the substrate of at least one of Examples 1-46 includes situating a memory die over the substrate.

In Example 48, electrically coupling the first and second circuit elements of at least one of Examples 1-47 includes electrically coupling first and second electrically conductive vias to the electrically conductive member.

In Example 49, the method of at least one of Examples 1-48 includes situating a first pad on, or at least partially in, a top surface of the interconnect element.

In Example 50, situating the first pad of at least one of Examples 1-49 includes situating the first pad between (1) the first electrically conductive via and (2) a first end of the electrically conductive member.

In Example 51, electrically coupling the first and second electrically conductive vias of at least one of Examples 1-50 includes electrically coupling the first electrically conductive via to the first pad.

In Example 52, the method of at least one of Examples 1-51 includes situating a second pad on, or at least partially in, the top surface of the interconnect element.

In Example 53, situating the second pad includes situating the second pad between (1) the second electrically conductive via and (2) a second end of the electrically conductive member.

In Example 54, electrically coupling the first and second electrically conductive vias of at least one of Examples 1-53 includes electrically coupling the second electrically conductive via to the second pad.

In Example 55, situating the first pad of at least one of Examples 1-54 includes situating a first pad that includes a footprint dimension of about 50 micrometers.

In Example 56, electrically coupling the first and second circuit elements of at least one of Examples 1-55 includes electrically coupling a first circuitry element that includes a footprint dimension of about 30 micrometers.

In Example 57, the method of at least one of Examples 1-56 includes situating an adhesive layer 122 over the dielectric layer.

The above description of embodiments includes references to the accompanying drawings, which form a part of the description of embodiments. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) can be used in combination with each other. Other embodiments can be used such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above description of embodiments, various features can be grouped together to streamline the disclosure. This should not be interpreted as intending that an unclaimed disclosed feature is essential to any claim. Rather, inventive subject matter can lie in less than all features of a particular disclosed embodiment. Thus, the following claims are hereby incorporated into the description of embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. An apparatus, comprising:
   a metal pad on an insulating layer of a medium;
   an adhesive layer directly on the metal pad;
   an interconnect element directly on the adhesive layer, the interconnect element having electrically conductive pads thereon, and the interconnect element comprising a silicon die;
   an insulator material above the top surface of the medium, the insulator material laterally adjacent the interconnect element;
   a first die over the interconnect element, the first die coupled to a first of the electrically conductive pads of the interconnect element; and
   a second die over the interconnect element, the second die coupled to a second of the electrically conductive pads of the interconnect element.

2. The apparatus of claim 1, wherein the metal pad has a width approximately the same as a width of the silicon die of the interconnect element.

3. The apparatus of claim 1, wherein the interconnect element is embedded in the medium.

4. The apparatus of claim 1, further comprising:
   a conductive structure laterally adjacent the interconnect element.

5. The apparatus of claim 4, wherein the conductive structure is electrically coupled to the first die.

6. The apparatus of claim 4, further comprising:
   an electrically conductive pad, wherein the conductive structure is on the electrically conductive pad.

7. The apparatus of claim 1, wherein the first die is a CPU die, and the second die is a memory die.

8. The apparatus of claim 1, wherein the first die is a memory die, and the second die is a CPU die.

9. An apparatus, comprising:
   a metal region on an insulating layer of a medium;
   an adhesive layer directly on the metal region;
   an interconnect element directly on the adhesive layer, the interconnect element having electrically conductive pads thereon, and the interconnect element comprising a silicon die;
   an insulator material above the top surface of the medium, the insulator material laterally adjacent the interconnect element;
   a first die over the interconnect element, the first die coupled to a first of the electrically conductive pads of the interconnect element; and
   a second die over the interconnect element, the second die coupled to a second of the electrically conductive pads of the interconnect element.

10. The apparatus of claim 9, wherein the metal region has a width approximately the same as a width of the silicon die of the interconnect element.

11. The apparatus of claim 9, wherein the interconnect element is embedded in the medium.

12. The apparatus of claim 9, further comprising:
    a conductive structure laterally adjacent the interconnect element.

13. The apparatus of claim 12, wherein the conductive structure is electrically coupled to the first die.

14. The apparatus of claim 12, further comprising:
    an electrically conductive pad, wherein the conductive structure is on the electrically conductive pad.

15. The apparatus of claim 9, wherein the first die is a CPU die, and the second die is a memory die.

16. The apparatus of claim 9, wherein the first die is a memory die, and the second die is a CPU die.

17. An apparatus, comprising:
    an adhesive layer directly on an insulating layer of a medium, the adhesive layer having a bottom surface;
    an interconnect element directly on the adhesive layer, the interconnect element having electrically conductive pads thereon, the interconnect element comprising a silicon die, and the interconnect element having a top surface;
    a conductive structure laterally adjacent the interconnect element and the adhesive layer, the conductive structure having a bottom surface co-planar with the bottom surface of the adhesive layer;
    an insulator material on the insulating layer of the medium, the insulator material laterally adjacent and in contact with the interconnect element, the insulator material laterally adjacent and in contact with the adhesive layer, and the insulator material laterally adjacent and in contact with the conductive structure;

a first die over the interconnect element, the first die coupled to a first of the electrically conductive pads of the interconnect element, and the first die electrically coupled to the conductive structure; and a second die over the interconnect element, the second die coupled to a second of the electrically conductive pads of the interconnect element, the second die electrically coupled to the first die by the interconnect element.

18. The apparatus of claim 17, wherein the conductive structure has a top surface co-planar with the top surface of the interconnect element.

19. The apparatus of claim 17, wherein the medium is a single insulator layer.

20. The apparatus of claim 17, wherein the top surface of the interconnect element is above a top surface of the insulator material.

21. The apparatus of claim 17, wherein the first die is a CPU die, and the second die is a memory die.

22. The apparatus of claim 17, wherein the first die is a memory die, and the second die is a CPU die.

\* \* \* \* \*